(12) United States Patent
Hwang et al.

(10) Patent No.: US 6,346,838 B1
(45) Date of Patent: Feb. 12, 2002

(54) INTERNAL OFFSET-CANCELED PHASE LOCKED LOOP-BASED DESKEW BUFFER

(75) Inventors: Chorng-Sii Hwang, Taichung; Wen-Wel Chiu, Taipei, both of (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/755,849

(22) Filed: Jan. 5, 2001

(51) Int. Cl.[7] .................................................. H03L 7/06
(52) U.S. Cl. ........................................ 327/156; 327/158
(58) Field of Search .................................. 327/146, 147, 327/148, 149, 150, 152, 153, 155, 156, 157, 158, 159, 161, 163; 331/17; 375/373–376

(56) References Cited

U.S. PATENT DOCUMENTS

| | | | |
|---|---|---|---|
| 5,371,764 A | * 12/1994 | Gillingham et al. | ........ 375/106 |
| 5,594,376 A | * 1/1997 | McBride et al. | ............ 327/236 |
| 5,642,082 A | * 6/1997 | Jefferson | ..................... 331/25 |
| 6,127,866 A | * 10/2000 | Chu et al. | .................... 327/158 |
| 6,208,183 B1 | * 3/2001 | Li et al. | ..................... 327/161 |

\* cited by examiner

*Primary Examiner*—My-Trang Nuton
(74) *Attorney, Agent, or Firm*—Blakely Sokoloff Taylor & Zafman, LLP

(57) ABSTRACT

A phase lock loop-based deskew buffer circuit includes a fixed delay element to delay a feedback signal and to generate a first signal from the feedback signal. A delay locked loop (DLL) generates a second signal from a reference signal and compares a phase of the feedback signal with a phase of the reference signal. The DLL is capable of keeping a relative timing of the first and second signals constant while adjusting the feedback signal to be in phase with the reference signal. This results in loop stability and cancellation of internal offset.

2 Claims, 4 Drawing Sheets

INTERNAL OFFSET-CANCELED PHASE LOCKED LOOP-BASED DESKEW BUFFER

BACKGROUND OF THE INVENTION

1. Field of the Invention

The present invention relates to integrated circuits, and more particularly, to a deskew buffer having a delay-locked loop.

2. Background Information

The phase-locked loop (PLL) circuit is widely used in integrated circuit design. The PLL is used in applications such as clock generators, clocks/data recovery, deskew buffers, and frequency synthesizers.

For synchronous systems, the skew (e.g., phase offset or time difference) between input and feedback clocks signals degrades the timing budget of the synchronous operation. In a high-speed digital application, the PLL often serves as the on-chip clock generator or deskew buffer to synchronize with the external system frequency and to minimize skew. A delay-locked loop (DLL) circuit is often used to aid in the deskew application. The main difference between a PLL and a DLL in the deskew application is that the PLL can provide different frequencies via divider ratios, while the DLL can provide only a fixed frequency in most cases.

A prior art PLL-based deskew buffer circuit 10 is shown in FIG. 1. The main goal of the PLL-based deskew buffer is to align the phases of the input clock CLK_IN and feedback clock CLK_FB. The circuit 10 includes a reference divider 12 to receive an input clock signal CLK_IN and to output a reference signal REF. The reference signal REF forms a first input into a phase/frequency detector (PFD) 26. At the other end of the circuit 10, a clock tree unit 14 receives an output clock signal CLK_OUT from a voltage-controlled oscillator (VCO) 24 and outputs a feedback clock signal CLK_FB. The feedback clock signal CLK_FB is fed into a feedback divider 16, which in turn outputs a signal FB. The signal FB forms a second input into the PFD 26.

When the PLL is in-lock to provide the desired PLL output frequency, the skew (e.g., internal phase/time offset) between the input clock signal CLK_IN and the feedback clock signal CLK_FB that comes from the PLL might still exist. In other words, while the frequency of the feedback clock signal CLK_FB may be exactly locked to a multiple of the frequency of the input clock signal CLK_IN, their phases, however, may be only "approximately" locked. Internal components in the circuit 10 contribute to this slight offset or skew in their phases.

The amount of this skew depends on the type of circuit component selected, such as a charge pump 20, loop filter 22, and VCO 24. For fixed-frequency operation, the offset might be determined and avoided in advance. For example, one only needs to add some predetermined fixed delay in the signal paths to cancel their skew. For wide-frequency range operation of the PLL (e.g., where the PLL may be required during operation to adjust to different frequencies over a wide range), the control voltage $V_c$ of the VCO 24 derived from the charge pump 20 and the loop filter 22 will vary as the PLL adjusts to different frequencies. The charge injection amount caused from switches (not shown) of the charge pump 20 will be different for different control voltages $V_c$. This may severely affect the phase performance of the PLL. It means that, at different control voltages $V_c$ (at the loop filter's 22 output), the voltage difference will also be different even though the input clock signal CLK_IN and feedback clock signal CLK_FB may be in phase for one of the control voltages $V_c$.

FIG. 2 helps to further illustrate this problem. First, most of the frequently used PFDs 26 generate both up (UP) and down (DN) pulses to avoid a dead zone. At different operating frequencies (e.g., at different control voltages $V_{C1}$, $V_{C2}$, $V_{C3}$ of the VCO 24), the curves of the phase difference Φ between the input clock signal CLK_IN and the feedback clock signal CLK_FB versus voltage change V are shown in FIG. 2, where V represents a change in the control voltage $V_c$. Many PLLs will have an ideal control voltage $V_{c2}$, where the input clock signal CLK_IN and feedback clock signal CLK_FB are in phase.

However, under certain situations when the control voltage $V_c$ changes from the ideal control voltage $V_{c2}$, to other control voltages, the net charge injected into the loop filter 22 (comprising of a resistor and capacitors) is not zero even though the input clock signal CLK_IN and feedback clock signal CLK_FB are in phase. In other words, the phenomenon means that an internal offset exists between the input clock signal CLK_IN and the feedback clock signal CLK_FB when the PLL output frequency is locked.

For example in FIG. 2, if the control voltage $V_c$ of the VCO 24 is operating at a control voltage $V_{c1}$, to provide an in-lock frequency, then $t_{o1}$, is a phase/time offset between the input clock signal CLK_IN and the feedback clock signal CLK_FB. That is, the phase offset $t_{o1}$, between these two signals at the control voltage $V_{c1}$ is represented by the phase/time difference between the $V_{c1}$ and $V_{c2}$ curves caused by charge injection.

As discussed, this phase/time offset can degrade performance. Therefore, what is needed is an improved deskew buffer.

BRIEF DESCRIPTION OF THE DRAWINGS

A non-limiting embodiment of the present invention is illustrated by way of example in the accompanying figures, wherein like reference numerals refer to like parts throughout the various views unless otherwise specified.

DETAILED DESCRIPTION OF THE ILLUSTRATED EMBODIMENTS

Embodiments of a PLL-based deskew buffer circuit to cancel internal offset are described in detail herein. In the following description, numerous specific details are provided, such as the description or identification of various PLL components in FIG. 3, to provide a thorough understanding of embodiments of the invention. One skilled in the relevant art will recognize, however, that the invention can be practiced without one or more of the specific details, or with other methods, components, etc. In other instances, well-known structures or operations are not shown or described in detail to avoid obscuring aspects of various embodiments of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Embodiments of the present invention address the previously described internal offset problem of the prior art by adding to a PLL circuit, a fixed delay element and a DLL. According to an embodiment of the invention, the DLL includes two voltage-controlled delay lines (VCDLs), a phase detector, and a capacitor.

Figure 1:
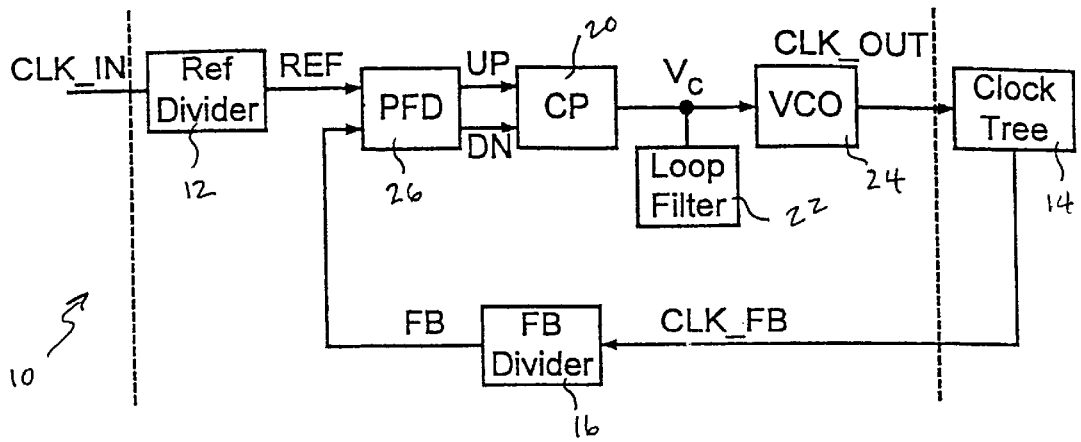
FIG. 1 is a schematic diagram of a prior art PLL-based deskew buffer circuit.
Figure 2:
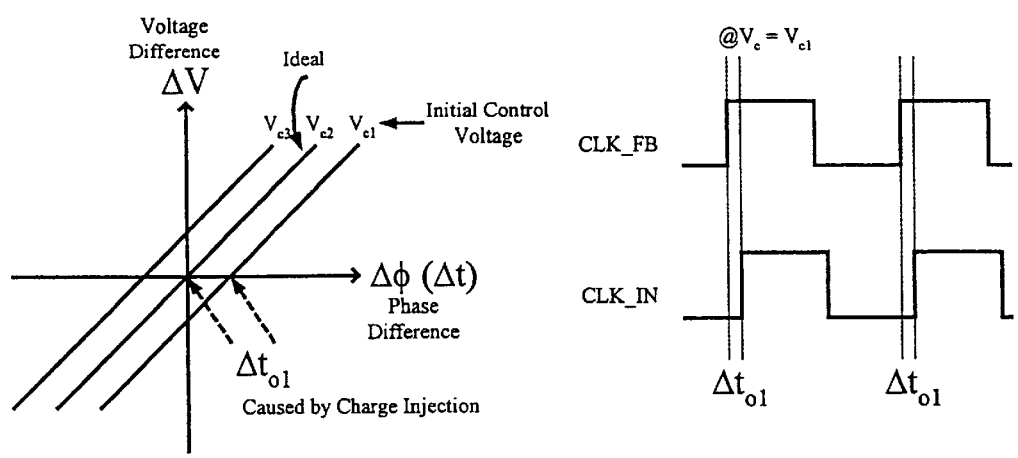
FIG. 2 are diagrams illustrating a phase offset problem of the circuit of FIG. 1.
Figure 3:
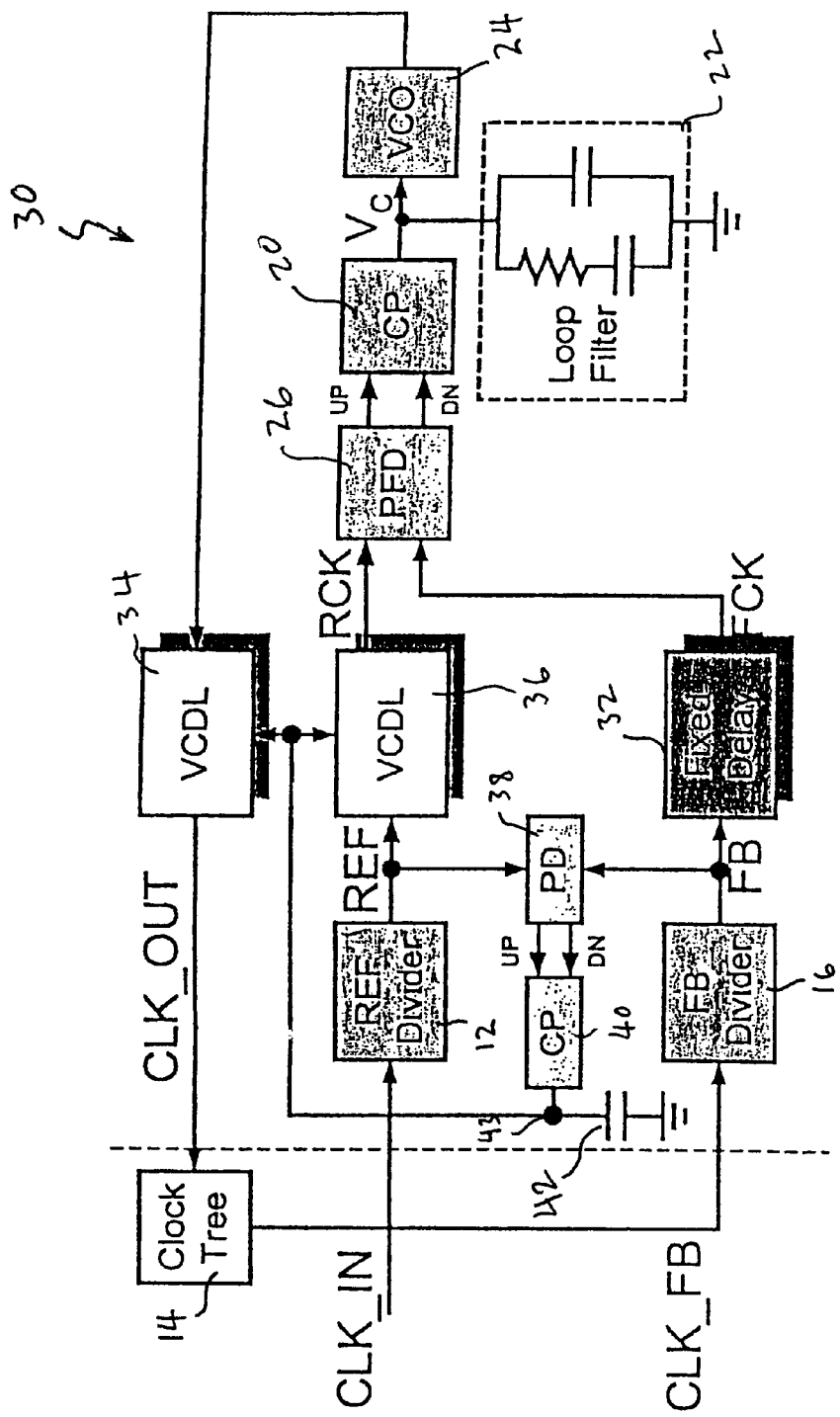
FIG. 3 is a schematic diagram of a PLL-based deskew buffer circuit in accordance with an embodiment of the present invention.

An embodiment of such a PLL-based deskew buffer circuit is generally shown at 30 in FIG. 3. A fixed delay element 32 is added to the feedback loop between the feedback divider 16 and the PFD 26. The fixed delay element 32 receives the signal FB as an input, delays it, and outputs it as an FCK signal. The FCK signal is in turn sent to a first input of the PFD 26.

The DLL components of the deskew buffer circuit 30 include a first VCDL 34 coupled between an output of the VCO 24 and an input of the clock tree unit 14. The VCDL 34 outputs the output clock signal CLK_OUT. A second VCDL 36 is coupled between an output of the reference divider 12 and a second input of the PFD 26. The VCDL 36 receives an REF input signal from the reference divider 12 and outputs an RCK signal into the PFD 26.

The DLL components further include a phase detector 38 that compares the phases of the REF and FB signals, with the phase detector 38 generating up (UP) and down (DN) pulses. A charge pump 40 has input terminals to receive the UP and DN pulses and an output terminal coupled to a capacitor 42 connected to ground. The capacitor 42 functions similarly as the loop filter 22. The voltage at a node 43 common to the capacitor 42 and to the output of the charge pump 40 is used as the control voltage input for the VCDLs 34 and 36 to control the amount of delay generated by the VCDLs 34 and 36. That is, and as will be shown in detail with respect to FIG. 7, the UP and DN pulses generated by the phase detector 38 results in the opening/closing of switches in the charge pump 40. The opening and closing of these switches control the charging/discharging of the capacitor 42, thereby changing the voltage at the node 43 that controls the VCDLs 34 and 36.

According to an embodiment of the invention, the output signals FB and REF of the feedback divider 16 and the reference divider 12, respectively, are used to perform phase alignment for both the input clock signal CLK_IN and feedback clock signal CLK_FB, since the reference divider 12 and feedback divider 16 produce the same delay, if any. Alternatively, an embodiment of the invention may directly use the input clock signal CLK_IN and feedback clock signal CLK_FB to perform phase alignment. The desired result is that the signals FB and REF (and hence the input clock signal CLK_IN and feedback clock signal CLK_FB) are exactly in phase, with the skew being canceled.

The actual signals that are sent into the PFD 26 of the PLL are the RCK and FCK signals. The RCK signal is a version of the REF signal that has been delayed by the VCDL 36, and the FCK signal is a version of the FB signal that has been delayed by the fixed delay element 32, with the FB signal itself being previously delayed by the VCDL 34.

FIG. 4a shows a situation where the FCK signal leads the RCK signal, and FIG. 4b shows a situation where the FCK signal lags the RCK signal. Operation of the deskew buffer circuit 30 of FIG. 3 is explained first with reference to FIG. 4a. The timing diagrams 44 show a situation where the FCK signal leads the RCK signal by an amount $t_{od}$. According to one embodiment, this relative timing of the FCK and RCK signals with respect to each other is preserved in order to maintain loop stability. A time difference $t_f$ between the FB and FCK signals represents the time difference generated by the fixed delay element 32. A time difference $t_a$ represents the amount of time that the FB signal needs to be adjusted in order to be in phase with the REF signal, while the REF signal is kept unchanged. That is, $t_a$ represents the amount of skew that is to be canceled.

Initially in operation and in accordance with an embodiment of the invention, the fixed delay element 32 pulls back (e.g., delays) the FB signal (which is generated from the feedback divider 16), such that the FB signal leads the REF signal. It is noted also that the FCK signal retains its timing relative to the FB signal, as the FCK signal is a delayed version of the FB signal. Then, the two identical VCDLs 34 and 36 move the CLK_OUT signal (e.g., the CLK_FB and FB signals) and REF signal together, so that the RCK and FCK signals, respectively, move in parallel without affecting their relative timing difference $t_{od}$. Doing this means that the loop behavior of the PLL still heads toward the lock-in state and is not affected by the newly added VCDLs 34 and 36.

In the meantime, the DLL also tracks both the REF and FB signals to cancel the internal phase offset. In other words, after the FB signal has been pulled back, the delay or $t_a$ is adjusted such that the FB signal approaches the REF signal (e.g., they become in phase) when the PLL is stable. The FB signal is adjusted to be in phase with the REF signal by first detecting their phase difference with the PFD 38, using the charge pump 40 and the capacitor 42 to produce a control voltage at the node 43 corresponding to the time $t_a$ for adjustment, and then using that control voltage to control the VCDL 34, such that the VCDL 34 can adjust (e.g., delay) the timing of the FB signal to be in phase with the REF signal.

When the PLL is locked, the DLL will also become locked to finally minimize the internal phase offset between the input clock signal CLK_IN and the feedback clock signal CLK_FB. An internal offset of over 500 picoseconds can be canceled by proper design of the VCDLs 34 and 36 and the fixed delay element 32.

FIG. 4b shows timing diagrams 48 and 50 where the lagging position of the FCK signal relative to the RCK signal (e.g., $t_{og}$) is preserved, while the FB signal is adjusted to be in phase with the REF signal. The same principles of operation described above with respect to FIG. 4a are applicable to FIG. 4b.

Figure 4:
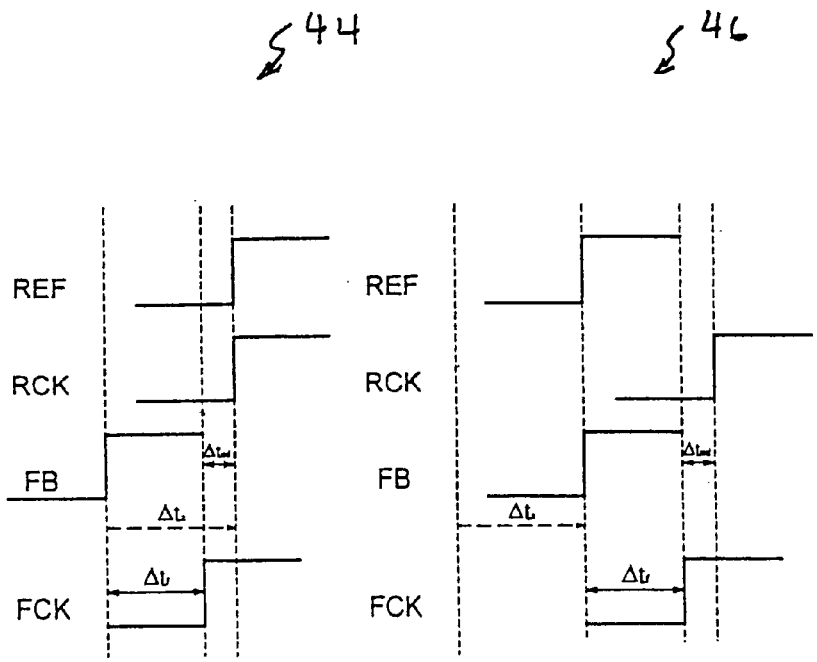
FIG. 4 is a timing diagram showing the operation of the deskew buffer circuit of FIG. 3.
Figure 5:
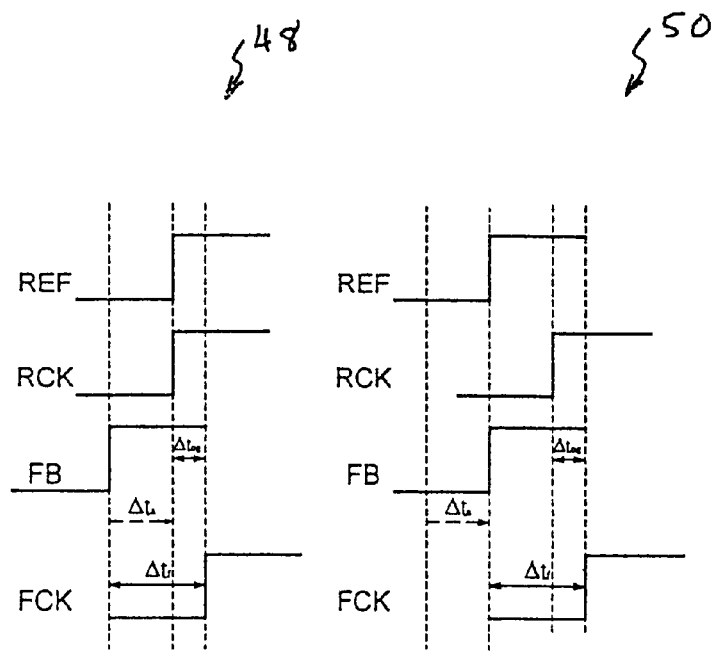
FIG. 5 is another timing diagram showing the operation of the deskew buffer circuit FIG. 3.

From the signal diagrams 44–50 of FIGS. 4–5, the following relationships can be derived:

$$t_a = t_f + t_o,$$

where:

$t_a$=adjusted time by the VCDLs 34 and 36;

$t_f$=fixed delay time generated by the fixed delay element 32; and $t_o$=offset time offset time between the FCK and RCK signals.

For FIG. 4, $t_o=t_{od}$ where the FCK signal leads the RCK signal. For FIG. 5, $t_o=-t_{og}$ where the FCK signal lags the RCK signal.

Since $t_f+t_o \geq 0$, we have the following as a consideration for the fixed delay time:

$$t_f \geq t_{og(max)} \qquad (1).$$

A design criteria according to Equation (1) means that the fixed delay time $t_f$ can be at least larger than a maximum value of the lag offset time $t_{og}$ (e.g., larger than $t_{og(max)}$)

Since $t_a=t_f+t_o$, we have the following relationship if $t_f$ if chosen:

$$t_a \geq t_f + t_{od(max)} \qquad (2\text{-}1)$$

and the following relationship if $t_f$ is chosen to be $t_{og}$:

$$t_a \geq t_{og(max)} + t_{od(max)} \qquad (2\text{-}2).$$

That is, if the fixed delay time $t_f$ is equal to its minimum value (e.g., equal to $t_{og(max)}$, the maximum value of the lag offset time $t_{og}$), Equation (2-2) may be used as a design criteria. If $t_f \geq t_{og(max)}$, Equation (2-1) may be used as a design criteria.

Figure 6:
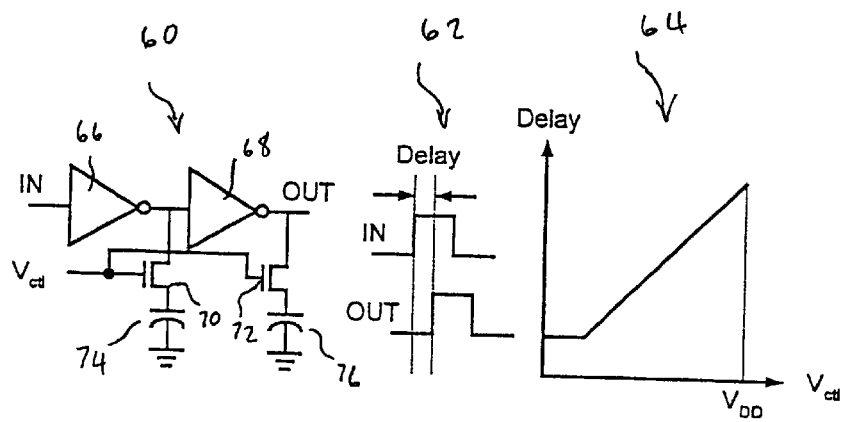
FIG. 6 is a schematic diagram of an embodiment of a delay circuit for the deskew buffer circuit of FIG. 3.

An embodiment of a RC-type delay circuit 60 is shown in FIG. 6, along with corresponding signal diagrams 62 and 64. This type of delay circuit may be used for the fixed delay element 32 and the VCDLs 34 and 36. The delay circuit 60 includes a pair of series-connected, inverted output inverters 66 and 68. First terminals of MOS transistors 70 and 72 are respectively coupled to outputs of the inverters 66 and 68. Second terminals of the transistors 70 and 72 are respectively coupled to capacitors 74 and 76 connected to ground. A control voltage $V_{ctl}$ is provided to third terminals (e.g., gates) of the transistors 70 and 72.

An input signal IN (e.g., the FB signal, REF signal, or output signal of the VCO 24) is delayed by the delay circuit 60, with a corresponding output signal OUT (e.g., the output clock signal CLK_OUT or the RCK signal) being produced, as shown by the signal diagram 62. The length of the delay (e.g., $t_f$ or $t_a$) can be controlled by varying the magnitude of the control voltage $V_{ctl}$, as represented in the diagram 64 of FIG. 6

Figure 7:
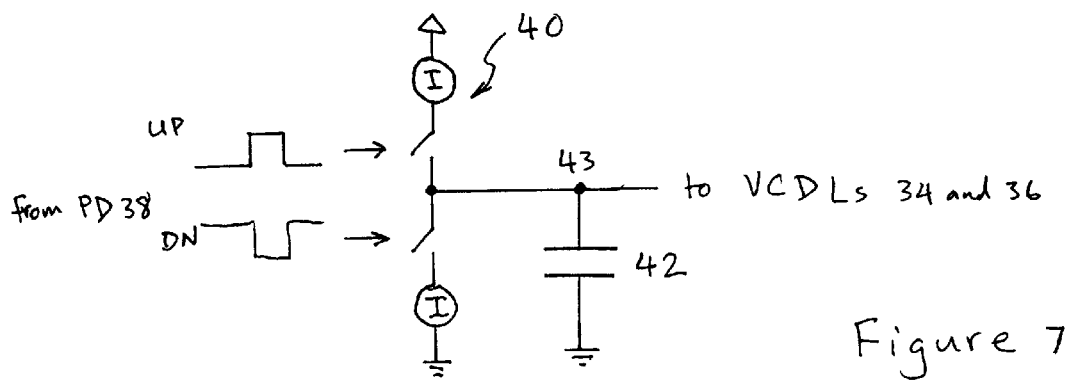
FIG. 7 is a schematic diagram of a charge pump for the deskew buffer circuit of FIG. 3.

FIG. 7 shows an embodiment of the charge pump 40 that can be used in the DLL along with a "bang-bang type" phase detector 38, capacitor 42, and VCDLs 34 and 36. According to the illustrated embodiment, the charge pump 40 can be a current-mode charge pump that uses a low charge pump current I.

Using a bang-bang type phase detector, the UP and DN pulses will switch back and forth between the zero skew in the stable state. This means that the skew (phase offset) between RCK and FCK (e.g. CLK_IN and CLK_FB) can be reduced to a relatively small amount which is almost zero. See, for example, Waizman, "A Delay Line Loop for Frequency Synthesis of De-skewed Clock", Solid State Circuits Conf., 1994, Digest of Technical Papers, 41st ISSCC, 1994 IEEE Int'l, pages 298–299.

An advantage of using the DLL in the PLL-based deskew buffer according to an embodiment of the invention is that the jitter performance is not affected too severely while compared to the PLL itself. Further, the jitter is potentially smaller than in a PLL that does not include a DLL. Note also that a lock detector is not needed because the DLL loop is designed to be slow-varying. Therefore, no special reset signal is needed. The phase detector 38 uses an auto-locking process and has a bang-bang structure with low charge pump current. This can lower the jitter added to the output clock. Embodiments of the invention provide a substantially guaranteed performance of phase offset cancellation, using a relatively simple structure.

The above description of illustrated embodiments of the invention is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A phase lock loop-based deskew buffer circuit, the deskew buffer circuit comprising:
   a fixed delay element to delay a feedback signal and to generate a first signal therefrom; and
   a delay locked loop (DLL) to generate a second signal from a reference signal and to compare a phase of the feedback signal with a phase of the reference signal, the DLL being capable of keeping a relative timing of the first and second signals constant while adjusting the feedback signal to be in phase with the reference signal, wherein the DLL comprises:
   a first voltage control delay line (VCDL) to receive the reference signal;
   a second VCDL in a feedback loop to output the feedback signal;
   a phase detector to compare phases of the reference and feedback signals; and
   a capacitor circuit to generate a control voltage for the VCDLs to allow the VCDLs to adjust the phase of the feedback signal relative to the reference signal if the phases detected by the phase detector are out of phase.

2. The deskew buffer circuit of claim 1 wherein the capacitor circuit comprises a charge pump coupled to a capacitor, the charge pump being coupled to an output of the phase detector and being capable of charging the capacitor based on a phase difference of the reference and feedback signals.

* * * * *